(«12») United States Patent
Ben-Yishay

(10) Patent No.: US 10,686,474 B1
(45) Date of Patent: Jun. 16, 2020

(54) DUAL-MODE FREQUENCY MULTIPLIER

(71) Applicant: SEMICONDUCTOR COMPONENTS INDUSTRIES, LLC, Phoenix, AZ (US)

(72) Inventor: Roee Ben-Yishay, Haifa (IL)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/454,749

(22) Filed: Jun. 27, 2019

Related U.S. Application Data

(60) Provisional application No. 62/776,040, filed on Dec. 6, 2018.

(51) Int. Cl.
| | | |
|---|---|---|
| *H03B 19/00* | (2006.01) | |
| *H04B 1/00* | (2006.01) | |
| *H03K 5/00* | (2006.01) | |
| *H04B 1/403* | (2015.01) | |
| *H03D 7/00* | (2006.01) | |
| *H03L 7/099* | (2006.01) | |

(52) U.S. Cl.
CPC ............ *H04B 1/0082* (2013.01); *H03D 7/00* (2013.01); *H03K 5/00006* (2013.01); *H03L 7/099* (2013.01); *H04B 1/403* (2013.01)

(58) Field of Classification Search
CPC ........ H03B 19/00; H03B 19/10; H03B 19/14; H03B 19/16; H03B 9/01; H04B 1/0082; H04B 1/403; H03D 7/00; H03D 7/125; H03K 5/00006; H03K 3/72; H03L 7/099; G01R 31/2841
See application file for complete search history.

(56) References Cited

U.S. PATENT DOCUMENTS

| 4,734,591 A | 3/1988 | Ichitsubo | |
|---|---|---|---|
| 8,786,330 B1 * | 7/2014 | Chakraborty | ......... H03B 19/14 327/119 |
| 2015/0130517 A1 * | 5/2015 | Lee | ........................ H03B 19/14 327/122 |

OTHER PUBLICATIONS

Jian Guo et al., "Design of Dual-Mode Frequency Multiplier With Schottky Diodes," IEEE Microwave and Wireless Components Letters, vol. 24, No. 8, Aug. 2014, pp. 554-556.
Shadi Saberi Ghouchani et al., "A Wideband Millimeter-Wave Frequency Doubler-Tripler in 0.13-μm CMOS," 2010 IEEE Radio Frequency Integrated Circuits Symposium, Conference Paper, Aug. 2010, pp. 65-68.

\* cited by examiner

*Primary Examiner* — Long Nguyen
(74) *Attorney, Agent, or Firm* — Ramey & Schwaller, LLP

(57) ABSTRACT

One illustrative dual mode frequency multiplier embodiment includes: a first and a second nonlinear element, a summation node, and a switchable phase shifter. The first and second nonlinear elements are driven by a differential signal to produce a first and a second branch signal each having even and odd harmonics, the even harmonics being in-phase and the odd harmonics being out of phase. The first and second branch signals combine at the summation node to form a combined signal. The switchable phase shifter couples the first nonlinear element to the summation node, providing the first branch signal with a phase shift switchable between 0 and 180° to suppress either the odd or the even harmonics from the combined signal.

19 Claims, 3 Drawing Sheets

DUAL-MODE FREQUENCY MULTIPLIER

CROSS-REFERENCE TO RELATED APPLICATIONS

The present application claims priority to Provisional Application 62/776,040, filed 2018 Dec. 6 and titled "Dual-mode frequency multiplier" by inventor Roee Ben-Yishay. This provisional is hereby incorporated herein by reference.

BACKGROUND

With the development of fifth generation communication systems, multiple mm-wave bands have been allocated worldwide including, but not limited to, spectra around 28 and 39 GHz. The availability of multiple such bands enables integrated frequency-reconfigurable transceivers to facilitate multiple-input and multiple-output (MIMO) frequency diversity and to reduce the cost of silicon (Si) integrated circuit (IC) components eliminating the need for a dedicated IC for each band. Such multi-band transceivers can achieve adequate performance with existing multi-band components, such as low noise amplifiers (LNA), power amplifiers (PA), and filters.

Gigahertz-band transceivers routinely employ frequency multipliers. Existing variable multiplier designs may use self-mixing or injection locking, but inherently suffer from low output power, insufficient harmonic rejection, and/or separate outputs for different tones. Some designs may use complex frequency generation circuitry that includes paralleled multiplier and amplifier chains, switched by a multiplexer to a single output. Use of more than one voltage-controlled oscillator (VCO) or a multi-mode VCO may also be considered, though this approach would be expected to undesirably affect system complexity, chip area, and/or phase noise performance.

SUMMARY

The issues identified above may at least in part be addressed by the disclosed transceivers, frequency multipliers, and methods. One illustrative dual mode frequency multiplier embodiment includes: a first and a second nonlinear element, a summation node, and a switchable phase shifter. The first and second nonlinear elements are driven by a differential signal to produce a first and a second branch signal each having even and odd harmonics, the even harmonics being in-phase and the odd harmonics being out of phase. The first and second branch signals combine at the summation node to form a combined signal. The switchable phase shifter couples the first nonlinear element to the summation node, providing the first branch signal with a phase shift switchable between 0 and 180° to suppress either the odd or the even harmonics from the combined signal.

One illustrative dual-band transceiver embodiment includes: a phase lock loop (PLL), a dual-mode frequency multiplier having a switchable phase shifter, and a mixer. The PLL provides a PLL signal in a 10.5 GHz to 11.5 GHz frequency band. The dual-mode frequency multiplier converts the PLL signal into a local oscillator signal having a frequency double or triple that of the PLL signal based on whether the switchable phase shifter is set for a 0° or 180° phase shift. The mixer uses the local oscillator signal to upconvert a 6 GHz intermediate frequency transmit signal to a radio frequency transmit signal in the 28 GHz or 39 GHz frequency bands.

One illustrative frequency multiplication method includes: driving a first and a second nonlinear element with a differential signal to produce a first and a second branch signal each having even and odd harmonics, the even harmonics being in-phase and the odd harmonics being out of phase between the branch signals; coupling the first branch signal to a summation node to form a combined signal with the second branch signal, said coupling being performed with a switchable phase shifter; and switching the switchable phase shifter between 0° and 180° to suppress either the odd or the even harmonics from the combined signal.

Each of the foregoing embodiments may be employed individually or conjointly, and they may further employ one or more of the following optional features in any suitable combination: 1. filtering the combined signal to suppress a frequency band of the differential signal from the combined signal. 2. the switchable phase shifter includes first and second sections of an integrated transmission line each having a signal conductor and a return current conductor. 3. the signal conductors of the first and second sections are coupled together and the return current conductors of the first and second sections are coupled together to provide a 0° phase shift. 4. the signal conductor of the first section is coupled to the return current conductor of the second section and the return current conductor of the first section is coupled to the signal conductor of the second section to provide a 180° phase shift. 5. the first and second nonlinear elements each include a heterojunction bipolar transistor biased at an exponential portion of a characteristic current-voltage curve. 6. a second mixer uses the local oscillator signal to downconvert a radio frequency signal receive in the 28 GHz or 39 GHz frequency bands to a 6 GHz intermediate frequency receive signal. 7. a differential pair of transistors converts the PLL signal into first and second branch signals having even and odd harmonics, the even harmonics being in-phase and the odd harmonics being out of phase between the first and second branch signals, the differential pair of transistors being biased to operate in an exponential portion of their characteristic current-voltage curve. 8. the switchable phase shifter couples the first branch signal to a summation node to form a combined signal with the second branch signal. 9. a first switch pair that couples the signal conductors together and the return current conductors together to provide a 0° phase shift. 10. a second switch pair that couples the signal conductor of the first section to the return current conductor of the second section and the return current conductor of the first section to the signal conductor of the second section to provide a 180° phase shift. 11. the switch pairs each comprise SiGe heterjunction bipolar transistors. 12. the first and second sections each comprise coplanar waveguides. 13. a second switchable phase shifter that couples the second nonlinear element to the summation node. 14. one or more transformers couple the first and second branch signals to said switchable phase shifter and said second switchable phase shifter, respectively. 15. an input transformer that converts a single-ended input signal into said differential signal, the differential signal being supplied to bases of the heterojunction bipolar transistors with a bias signal. 16. The multiplier of claim 1, wherein the differential signal includes a fundamental frequency in a band from 10.5 GHz to 11.5 GHz.

DETAILED DESCRIPTION

It should be understood that the drawings and following description do not limit the disclosure, but on the contrary, they provide the foundation for one of ordinary skill in the art to understand all modifications, equivalents, and alternatives, falling within the scope of the claims.

Figure 1:
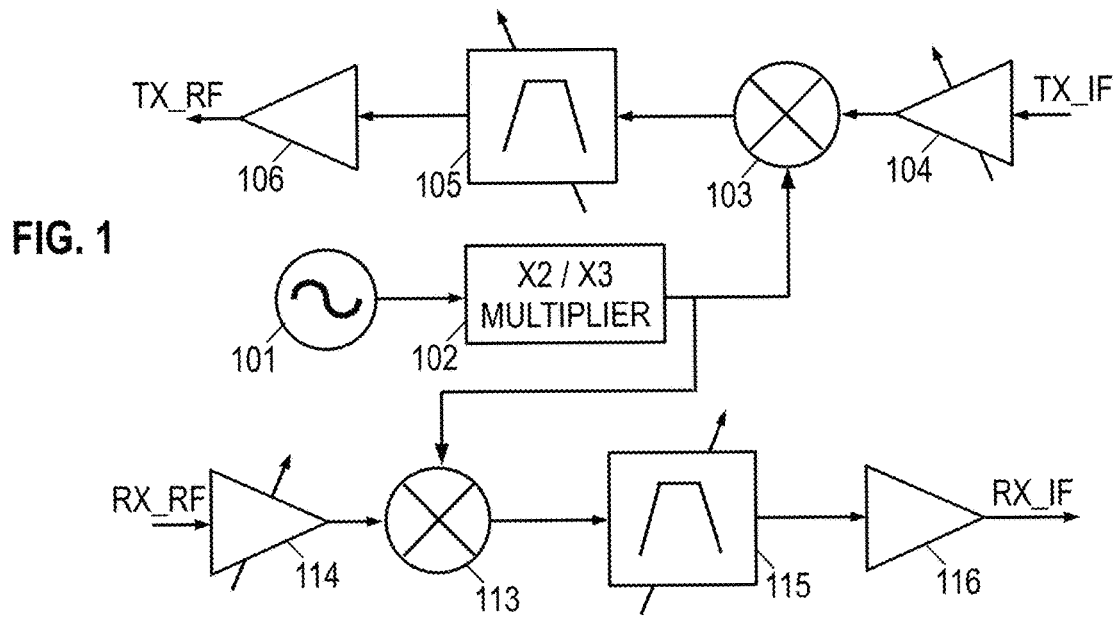
FIG. 1 is a schematic of an illustrative radio frequency (RF) transceiver having a multi-mode frequency multiplier.

Referring now to FIG. 1, there is shown an illustrative 28/39 GHz fifth generation (5G) transceiver with phase lock loop (PLL) frequency at 10.5-11.5 GHz and frequency doubler/tripler. The PLL signal may be provided by a voltage controlled oscillator (VCO) 101. For 28 GHz operation, the multi-mode frequency multiplier 102 doubles the PLL signal frequency to provide a 22 GHz local oscillator (LO) signal for the mixer 103, while for 39 GHz operation, the multiplier 102 may operate in tripler mode with an output at 33 GHz. For both bands, the wideband mixer 103 multiplies the LO signal with the intermediate frequency transmit (TX_IF) signal from variable gain amplifier (VGA) 104. The IF signal may be centered at 6 GHz, so that the mixer produces up-converted signals centered at about 28 GHz and 39 GHz, respectively. Bandpass filter 105 passes the desired frequencies of the up-converted signal from mixer 103, suppressing the energy of signal images at other frequencies, and driver 106 amplifies the up-converted converted signal to drive the radio frequency output (TX_RF).

The multi-mode frequency multiplier 102 may be similarly used to generate the LO signal for a second mixer 113 that downconverts received RF signals (RX_RF) from the 28 GHz and 39 GHz bands to the 6 GHz band. A low noise VGA 114 supplies the RF signal to the mixer 113, and a bandpass filter 115 passes the desired frequencies of the down-converted signal as an intermediate frequency receive signal (RX_IF). An optional driver 116 buffers the receive signal.

Referring now to an example embodiment of the present disclosure, an integrated circuit (IC) transceiver may be fabricated using, e.g., a 120 nm SiGe8XP technology (available from Global Foundries of Santa Clara, Calif.) that provides high speed heterojunction bipolar transistors (HBTs) with $f_T/f_{max}$=260/340 GHz. This example process offers 7-layer metallization with a 4 µm thick Al upper metal and CMOS transistors that may also be utilized for RF purposes. Other suitable fabrication technologies are known and available.

The frequency multiplier 102 may be designed to achieve high harmonic rejection and sufficient output power in both modes to drive the mixer. A single-ended device, operating in a non-linear regime, may simultaneously generate strong 2nd and 3rd harmonics, and various approaches could be taken to reject the undesired harmonics. For example, a tunable and highly selective filter could be used to reject undesired harmonics, which may result in high insertion loss, potentially leading to output power loss. As another example, a conventional differential pair, with a common-node output or a balun-loaded output, could be used to generate higher output power, but only at either even or odd harmonics, respectively.

Here, it is desired to provide higher output power combined with configurable harmonic rejection for dual mode operation. Such a multi-mode frequency multiplier can be implemented using various technologies such as, but not limited to, SiGe BiCMOS technology, and may be paired with a driver amplifier. One example of such a driver amplifier is a transmission line based tuned driver amplifier, capable of 40% tuning range and more than 2 dBm output power over the full bandwidth range in both modes. Other driver amplifiers are known and would also be suitable. Such a frequency multiplier would enable a single VCO operating at X-Band, with moderate tuning range and low phase noise, to source the local oscillator (LO) signal for both 28 and 39 GHz bands with minimal area penalty.

Figure 2:
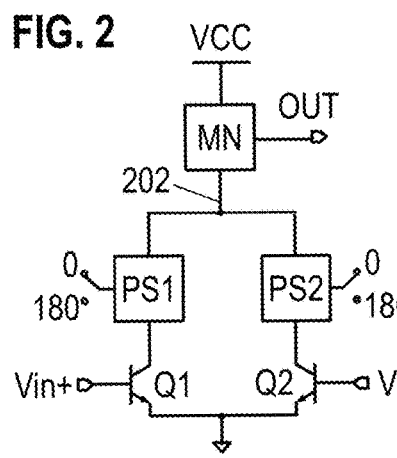
FIG. 2 is a schematic of an illustrative multi-mode frequency multiplier circuit.

Referring now to FIG. 2, some illustrative embodiments of a frequency multiplier may obtain dual mode operation using a 1-bit phase shifter (i.e. 0°/180°) following a differential pair. Transistors Q1, Q2 have a common emitter or source node coupled to ground and their collectors or drains Q1, Q2 are coupled to a summation node 202 by respective phase shifters PS1, PS2. The bases or gates of transistors Q1, Q2 are coupled to a differential input voltage Vin+, Vin−. An impedance matching network MN conveys the combined signal from the summation node 202 to the output terminal OUT, and may further provide a supply voltage to the summation node to bias the transistors Q1, Q2 at the desired operating point. The matching network may further operate to filter out the fundamental frequency and any undesired harmonics of the differential input voltage.

As it is desired to provide frequency multiplication, the transistors Q1, Q2 may be biased to operate in a nonlinear regime such as the exponential region of the HBT current-voltage curve, such that the collector current through Q1 includes strong 2nd and 3rd harmonics of the input signal $V_{in+}$=A cos(ωt) and the collector current through Q2 includes strong 2nd and 3rd harmonics of $V_{in-}$=−A cos(ωt). The even harmonics in the collector currents are unaffected by the sign difference of the inputs, whereas the odd harmonics are placed 180° out of phase. If the two phase shifters are in the same state, the even harmonics sum at the summation node 202 while the odd harmonics cancel. Conversely, if one of the phase shifters is switched 180° out of phase with the other, the even harmonics will cancel at the summation nodes while the odd harmonics sum together. In this fashion, the frequency multiplier can be readily switched between doubling and tripling the input signal frequency.

Figure 3A:
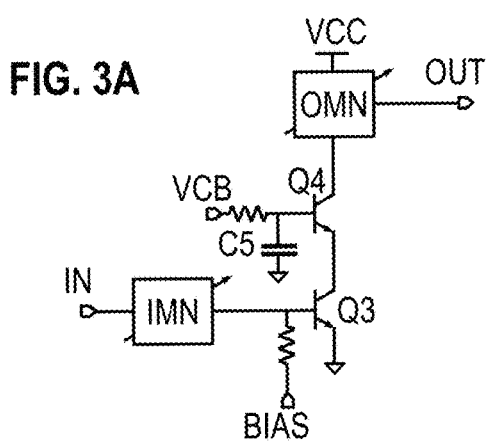
FIGS. 3A-3B are schematics of an illustrative multi-band driver-amplifier circuit.
Figure 3B:
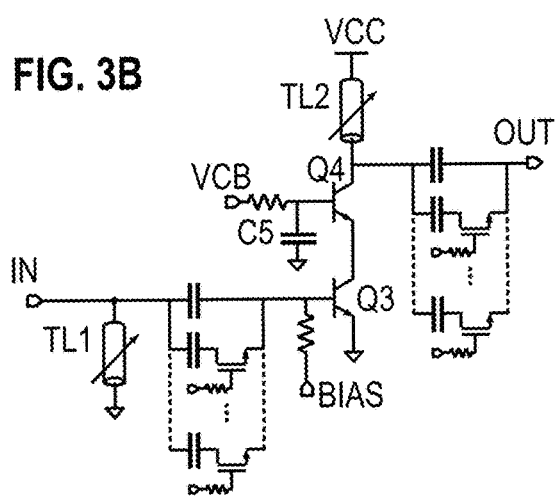

The frequency multiplier of FIG. 2 may be followed by a multi-band driver amplifier, such as that shown in FIGS. 3A and 3B, to achieve sufficient output power. Tuning the peak frequency from 22 to 33 GHz may be accomplished by variable matching networks, based on variable artificial transmission lines (T-lines) and switched capacitors.

The illustrative driver-amplifier employs two HBTs Q3, Q4 in a cascode amplifier configuration. The summation node signal may be conveyed by an input impedance matching network IMN to the base of transistor Q3, to which a bias voltage BIAS is also supplied via a resistor. The emitter is coupled to ground and the collector is coupled to the emitter of cascode transistor Q4. The base of cascode transistor Q4 receives a bias voltage VCB via a resistor and a capacitor C5. The cascode transistor's collector is coupled to an output terminal OUT by an output impedance matching network OMN. In some embodiments, a single matching network (MN) may be utilized at the output. The MN may be tuned closer to the 3rd harmonic optimal load impedance than the 2nd harmonic optimal load impedance to assist in equalizing the output power roll-off.

The matching networks may be adjustable to operate in multiple different frequency bands using the illustrative implementation of FIG. 3B. The illustrative IMN and OMN matching networks each include a simple LC network formed by a transmission line element TL1, TL2 providing a variable shunt impedance and capacitance, optionally in combination with a variable series capacitance which may be embodied as a parallel bank of one or more switched capacitors in parallel with a fixed capacitor. The switched capacitors can be selectively enabled to adjust the series capacitance, with different capacitance values yielding different passbands. Multi-mode operation may be achieved by tuning the input and output matching networks to the desired frequency range. TL1 and TL2 may represent cascaded unit T-line cells, as discussed further below.

Figure 4:
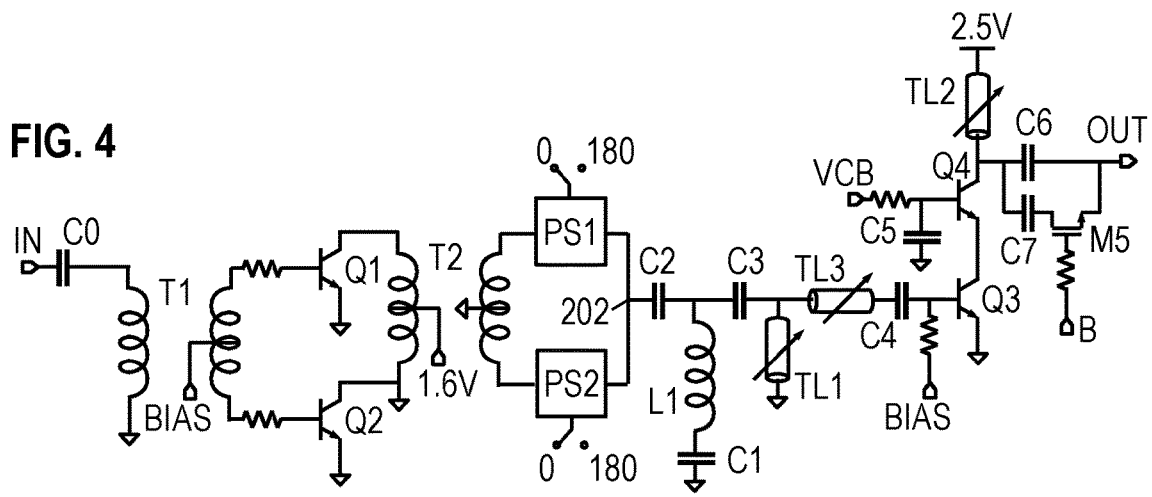
FIG. 4 is a schematic of an illustrative multi-mode frequency multiplier circuit including a dual-band output driver-amplifier.

FIG. 4 shows one possible implementation of the multiplier core having the differential pair of transistors Q1, Q2 transformer-coupled with the phase shifters PS1, PS2 to potentially avoid effects on its DC operating point. A single-ended PLL signal may be supplied to input terminal IN, which is AC coupled by capacitor C0 to the primary of transformer T1. Transformer T1 has a center-tapped secondary to convert the single-ended signal on the primary into a differential signal on the secondary. The secondary's center tap is coupled to a bias voltage BIAS for setting the DC operating point of transistors Q1, Q2. As previously mentioned, transistors Q1, Q2 are preferably biased to a non-linear portion of their current-voltage curve to generate strong harmonics in response to the input signal. The collectors of transistors Q1, Q2 are coupled to the ends of a center-tapped primary of transformer T2, the center tap of which is coupled to a supply voltage (shown here as 1.6 V). The collector currents from Q1, Q2 produce magnetic fields that may combine together in the primary of T2, but the secondary of T2 has a center tap coupled to ground, yielding a differential signal between the secondary's end terminals.

The phase shifters PS1, PS2 operate as described previously to reinforce either the even or odd harmonics at the summation node 202 according to whether the phase shifters are in the same state or 180° out of phase. Inductor L1 and capacitors C1, C2, C3, may form a filter having a high-pass filter response with a notch at the fundamental harmonic, which may be used in tripler modes that do not provide tone rejection besides the frequency response of the output balun. The notched high-pass filter conveys the multiplied signal from the summation node 202 to the input impedance matching network (IMN) formed by transmission line elements TL1, TL3, and capacitor C4. The base of transistor Q3 receives the filtered signal from the IMN. Q3 and Q4 form a cascode amplifier that amplifies the filtered signal, supplying it to the output impedance matching network (OMN) formed by transmission line element TL2, capacitor C6, and switched capacitor C7. A band selector input B is supplied to the gate of transistor M5 to selectably add the capacitance of C7 to capacitor C6.

Note that the FIG. 4 matching network designs vary somewhat from the designs of FIGS. 3A-3B, as they are tailored for dual band operation. As shown, the series capacitance at the driver output is divided into fixed and switched capacitors. Switches in the driver (e.g., transistor M5) may be implemented using triple-well nMOS devices with deep trench isolation for minimal parasitic capacitance to substrate. However, other suitable switching devices may be used instead. The driver may be designed for small signal gain with greater bandwidth (such as >8 GHz) in both modes. The driver's frequency response may be designed to further attenuate dominant out-of-band harmonics.

The phase shifters PS1, PS2 may provide frequency-independent phase shift, enabling a wideband design. Some embodiments may be further configured to reduce and balance insertion-loss (IL) to minimize degradation of output power and degradation of harmonic rejection.

Figure 5:
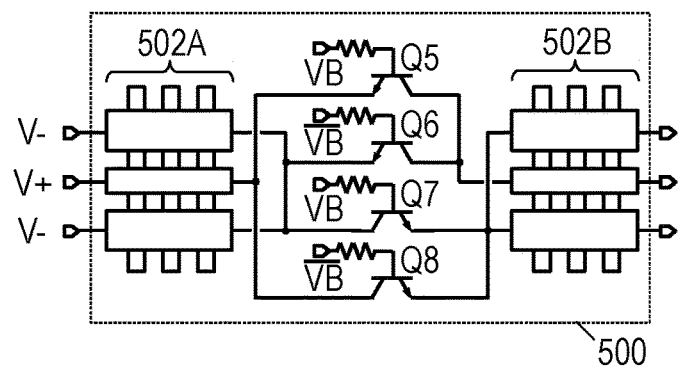
FIG. 5 is a schematic of an illustrative switchable phase shifter.

FIG. 5 shows one possible implementation of each phase shifter PS1, PS2. Phase shifter 500 may include two coplanar waveguide (CPW) transmission line sections 502A, 502B connected in series. The illustrated transmission line sections have a center conductor between two coplanar shield conductors. Insulated cross-conductors may optionally underlie and/or overlie the center and shield conductors to slow the signal propagation speed along the conductors. Phase shifter 500 further includes a switch arrangement Q5-Q8. Switches Q5 and Q7 are shown as NPN transistors that receive a selection voltage VB at their base, while switches Q6 and Q8 are shown as NPN transistors that receive an inverted selection voltage/VB at their base.

When selection voltage VB is asserted ("high"), switches Q5 and Q7 are ON, while switches Q6 and Q8 are OFF. When ON, switch Q5 couples the center conductor of section 502A to the center conductor of section 502B, and switch Q7 couples the shield conductors of section 502A to the shield conductors of section 502B. This direct connection configuration corresponds to zero phase shift as the signal propagates from section 502A to 502B.

When selection voltage VB is de-asserted ("low"), switches Q5 and Q7 are OFF, while switches Q6 and Q8 are ON. When ON, switch Q6 couples the center conductor of section 502A to the shield conductors of section 502B, and switch Q8 couples the shield conductors of section 502A to the center conductor of section 502B. This cross-connection configuration between signal paths and return current paths corresponds to 180° phase shift, or inversion, as the signal propagates from section 502A to 502B.

The size of the switches Q5-Q8 (which may be heterojunction bipolar transistors (HBTs) or field effect transistors (FETs)), as well as the interconnection layout (vias and metal levels), may be iteratively optimized to achieve low amplitude and phase errors.

Figure 6:
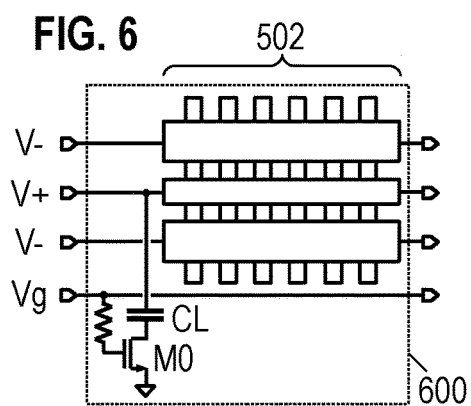
FIG. 6 is a schematic of an illustrative unit cell for a transmission line.

FIG. 6 shows a unit cell 600 of a slow-wave coplanar waveguide. The unit cell includes a coplanar waveguide transmission line section 502 having a center conductor between two coplanar shield conductors. Insulated cross-conductors may underlie and/or overlie the center and shield conductors to slow the signal propagation speed through the unit cell 600. The illustrated unit cell includes a load capacitance CL, which may take the form of a metal-insulator-metal (MIM) shunt capacitor that can be selectably coupled to ground by a switch M0. A gate voltage Vg turns the switch ON when asserted, adding the load capacitance to that of the center conductor and thereby slowing the propagation velocity ($\beta$). When de-asserted, switch M0 turns off, decoupling the load capacitance from ground and thereby removing the extra capacitive load from the center conductor, suppressing any slowdown of the propagation velocity through the unit cell. In other words, by switching CL, the unit length capacitance of the segment may be varied, resulting in tunable propagation velocity, which may be equivalent to tunable inductor in the case of shunt T-line.

The propagation velocity of such structure may be higher compared to conventional CPW or microstrip T-lines, leading to a compact layout.

Referring back to FIGS. 3B and 4, transmission line elements TL1, TL2 and TL3 may be composed of different numbers of cascaded unit cells to provide the desired response. For example, in one contemplated embodiment, TL1 is a cascade of two unit cells 600, TL2 is a cascade of five unit cells, and TL3 is a cascade of three unit cells. These values are expected to change based on the response of individual unit cells and the desired responses of the matching networks.

Figure 7A:
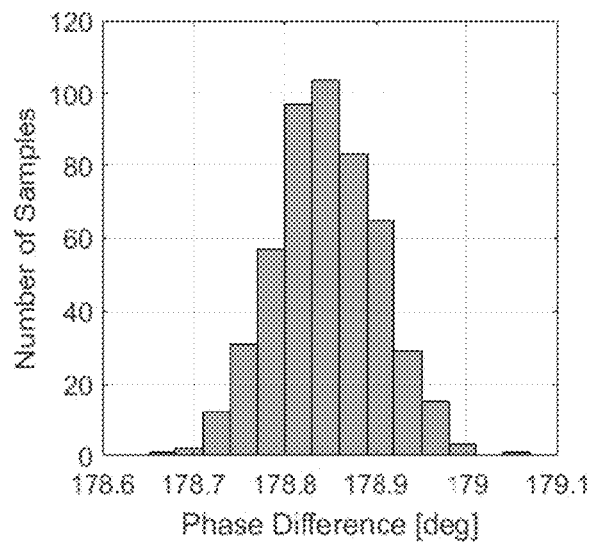
FIGS. 7A-7B are histograms showing effects of process variation.
Figure 7B:
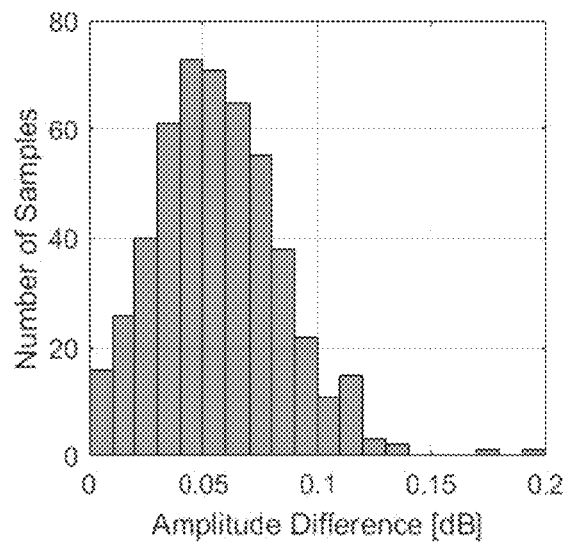

Monte-Carlo simulations have been performed on the embodiment of FIG. 3 to determine the effect of toggling one of the phase shifters between the two states. As shown in FIGS. 7A-7B, the simulation suggests that both the amplitude and phase error may be highly resilient to process variation, which leans towards a correct operation of the variable multiplier. In other words, the design is not dependent on any resonance or other effects that might be subject to process variation. The simulated HBT switches contributed very little harmonic distortion when operated well below their 1 dB compression point.

A transceiver chip was simulated using a signal generator at the input and a spectrum analyzer at the output for monitoring the output power up to the 5th harmonic. In this simulation, the multiplier's driver consumed 14 mA from 2.5 V and the multiplier core consumed 16 mA from 1.6 V supply. With an input frequency of 11 GHz, the maximum output power of the doubler was 5.6 dBm, which corresponds to 5.9% efficiency, and the maximum output power of the tripler was 3.4 dBm, which corresponds to 3.5% efficiency. The doubler achieved more than 27 dB rejection for all harmonics in the input frequency band of interest (10.5-11.5 GHz) and its 3 dB output power bandwidth extended from 19.6 to 25 GHz. The tripler had more than 25 dB rejection and a 3 dB power bandwidth at 29.1-35.4 GHz. The high fundamental rejection of the later may stem from the driver frequency response, as well as the explicit high-pass filter preceding the driver.

A network analyzer with an S-parameter setup was used to measure the performance of a breakout implementation of the driver amplifier. When all of the switches were collectively switched from "ON" to "OFF", the input and output matching as well as the peak gain shifted from 22.4 GHz to 32.5 GHz. The gain at the lower band was only 1 dB higher than at the upper band due to added losses associated with the switches and MIM capacitors present while the FETs are switched 'ON'.

A network analyzer with S-parameter setup was similarly used to measure the performance of a breakout implementation of the phase shifter. The phase shifter showed a measured insertion loss (IL) of 1.5 dB at 40 GHz. In the simulations, the IL difference between 0°/180° modes across the frequency range 5-45 GHz is 0.1 dB, while the phase imbalance is <2.5°.

Accordingly, there have been disclosed above embodiments of a frequency doubler-tripler including a K/Ka band single-path frequency doubler-tripler suitable for implementation with a 0.12 μm SiGe BiCMOS process. A compact and wideband 1-bit phase shifter enables switching between even and odd-mode operation and may be followed by an integrated frequency-reconfigurable driver, which optionally employs switched capacitor banks to enable coarse and fine tuning. The designed frequency doubler-tripler may enhance rejection of undesired harmonics and may serve as good alternative for wideband frequency synthesis, such as that used for dual-band 5G transceivers. A range of integrated transmission line implementations are known in the literature and may be employed to shrink the footprint of the matching networks.

The foregoing embodiments may omit complicating factors such as parasitic impedances, current-limiting resistors, level-shifters, line clamps, etc., which may be present but do not meaningfully impact the operation of the disclosed circuits. The transistors described herein as heterojunction bipolar transistors and/or field effect transistors can in practice be implemented using any suitable form of transistor or integrated circuit switch. These and numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. A dual mode frequency multiplier that comprises:
   a first and a second nonlinear element driven by a differential signal to produce a first and a second branch signal each having even and odd harmonics, the even harmonics being in-phase and the odd harmonics being out of phase;
   a summation node where the first and second branch signals combine to form a combined signal; and
   a switchable phase shifter that couples the first nonlinear element to the summation node, providing the first branch signal with a phase shift switchable between 0° and 180° to suppress either the odd or the even harmonics from the combined signal.

2. The multiplier of claim 1, further comprising: a filter that suppresses a frequency band of the differential signal from the combined signal.

3. The multiplier of claim 1, wherein the switchable phase shifter includes:
   first and second sections of an integrated transmission line each having a signal conductor and a return current conductor;
   a first switch pair that couples the signal conductors together and the return current conductors together to provide a 0° phase shift; and
   a second switch pair that couples the signal conductor of the first section to the return current conductor of the second section and the return current conductor of the first section to the signal conductor of the second section to provide a 180° phase shift.

4. The multiplier of claim 3, wherein the switch pairs each comprise SiGe heterjunction bipolar transistors.

5. The multiplier of claim 3, wherein the first and second sections each comprise coplanar waveguides.

6. The multiplier of claim 1, wherein the first and second nonlinear elements each comprise a heterojunction bipolar transistor biased at an exponential portion of a characteristic current-voltage curve.

7. The multiplier of claim 6, further comprising a second switchable phase shifter that couples the second nonlinear element to the summation node.

8. The multiplier of claim 7, wherein one or more transformers couple the first and second branch signals to said switchable phase shifter and said second switchable phase shifter, respectively.

9. The multiplier of claim 8, further comprising an input transformer that converts a single-ended input signal into said differential signal, the differential signal being supplied to bases of the heterojunction bipolar transistors with a bias signal.

10. The multiplier of claim 1, wherein the differential signal includes a fundamental frequency in a band from 10.5 GHz to 11.5 GHz.

11. A dual-band transceiver that comprises:
a phase-lock loop (PLL) providing a PLL signal in a 10.5 GHz to 11.5 GHz frequency band;
a dual-mode frequency multiplier that includes a switchable phase shifter, the dual-mode frequency multiplier converting the PLL signal into a local oscillator signal having a frequency double or triple that of the PLL signal based on whether the switchable phase shifter is set for a 0° or 180° phase shift; and
a mixer using the local oscillator signal to upconvert a 6 GHz intermediate frequency transmit signal to a radio frequency transmit signal in the 28 GHz or 39 GHz frequency bands.

12. The transceiver of claim 11, further comprising a second mixer using the local oscillator signal to downconvert a radio frequency signal receive in the 28 GHz or 39 GHz frequency bands to a 6 GHz intermediate frequency receive signal.

13. The transceiver of claim 11, wherein the dual-mode frequency multiplier includes a differential pair of transistors that convert the PLL signal into first and second branch signals having even and odd harmonics, the even harmonics being in-phase and the odd harmonics being out of phase between the first and second branch signals, the differential pair of transistors being biased to operate in an exponential portion of their characteristic current-voltage curve.

14. The transceiver of claim 13, wherein the switchable phase shifter couples the first branch signal to a summation node to form a combined signal with the second branch signal.

15. The transceiver of claim 11, wherein the switchable phase shifter includes:
first and second sections of an integrated transmission line each having a signal conductor and a return current conductor;
a first switch pair that couples the signal conductors together and the return current conductors together to provide a 0° phase shift; and
a second switch pair that couples the signal conductor of the first section to the return current conductor of the second section and the return current conductor of the first section to the signal conductor of the second section to provide a 180° phase shift.

16. A frequency multiplication method that comprises:
driving a first and a second nonlinear element with a differential signal to produce a first and a second branch signal each having even and odd harmonics, the even harmonics being in-phase and the odd harmonics being out of phase between the branch signals;
coupling the first branch signal to a summation node to form a combined signal with the second branch signal, said coupling being performed with a switchable phase shifter; and
switching the switchable phase shifter between 0° and 180° to suppress either the odd or the even harmonics from the combined signal.

17. The method of claim 16, further comprising: filtering the combined signal to suppress a frequency band of the differential signal from the combined signal.

18. The method of claim 16, wherein the switchable phase shifter includes first and second sections of an integrated transmission line each having a signal conductor and a return current conductor, and wherein said switching includes:
coupling the signal conductors of the first and second sections together and the return current conductors of the first and second sections together to provide a 0° phase shift; and
coupling the signal conductor of the first section to the return current conductor of the second section and coupling the return current conductor of the first section to the signal conductor of the second section to provide a 180° phase shift.

19. The method of claim 16, wherein the first and second nonlinear elements each comprise a heterojunction bipolar transistor biased at an exponential portion of a characteristic current-voltage curve.

* * * * *